United States Patent
Kulkarni et al.

(10) Patent No.: US 9,062,816 B2
(45) Date of Patent: Jun. 23, 2015

(54) TILT HEAD ASSEMBLIES AND METHODS OF USING THE SAME

(71) Applicant: Wirepath Home Systems, LLC, Charlotte, NC (US)

(72) Inventors: Amit Kulkarni, Redmond, WA (US); Bryan Thomas Marcum, Georgetown, KY (US); Kai-Sheng Cheng, Charlotte, NC (US)

(73) Assignee: WirePath Home Systems, LLC, Charlotte, NC (US)

( * ) Notice: Subject to any disclaimer, the term of this patent is extended or adjusted under 35 U.S.C. 154(b) by 150 days.

(21) Appl. No.: 13/734,191

(22) Filed: Jan. 4, 2013

(65) Prior Publication Data

US 2013/0176667 A1    Jul. 11, 2013

Related U.S. Application Data

(60) Provisional application No. 61/583,811, filed on Jan. 6, 2012.

(51) Int. Cl.
| | |
|---|---|
| *H05K 5/00* | (2006.01) |
| *H05K 7/00* | (2006.01) |
| *G06F 1/16* | (2006.01) |
| *E04G 3/00* | (2006.01) |
| *A47F 5/00* | (2006.01) |
| *A47H 1/10* | (2006.01) |
| *F16M 13/02* | (2006.01) |
| *H05K 7/18* | (2006.01) |
| *F16M 11/10* | (2006.01) |
| *F16M 11/20* | (2006.01) |

(52) U.S. Cl.
CPC ............. *F16M 13/022* (2013.01); *H05K 7/186* (2013.01); *F16M 11/10* (2013.01); *F16M 11/2014* (2013.01); *F16M 13/02* (2013.01); *F16M 2200/061* (2013.01); *F16M 11/2092* (2013.01)

(58) Field of Classification Search
CPC ............. G06F 1/1601; F16M 2200/02; F16M 2200/04; F16M 2200/06; F16M 2200/061; F16M 2200/065
USPC ........... 361/679.21, 679.01, 679.02; 248/917, 248/274.1, 276.1, 299.1
See application file for complete search history.

(56) References Cited

U.S. PATENT DOCUMENTS

| | | | |
|---|---|---|---|
| 4,928,914 | A | 5/1990 | Snodell |
| 5,934,636 | A | 8/1999 | Cyrell |
| 6,102,350 | A | 8/2000 | Cyrell |
| 6,402,109 | B1 | 6/2002 | Dittmer |
| D488,708 | S | 4/2004 | Lam et al. |
| D489,599 | S | 5/2004 | Lam |

(Continued)

*Primary Examiner* — Anthony Haughton
(74) *Attorney, Agent, or Firm* — Myers Bigel Sibley & Sajovec, PA

(57) ABSTRACT

A tilt head mechanism for use with a display device includes a base plate member configured to connect to a vertical mounting structure or surface and an adapter plate member operatively connected to the base plate member. The adapter plate member has a front surface configured to connect to a display device, and the front surface has a center point. The adapter plate member is independently: movable horizontally away from and toward the base plate member; and tiltable downwardly and upwardly relative to the vertical mounting structure or surface, wherein the front surface center point of the adapter plate member does not move substantially horizontally as the adapter plate member is tilted relative to the vertical mounting structure or surface.

20 Claims, 11 Drawing Sheets

(56) References Cited

U.S. PATENT DOCUMENTS

| | | | |
|---|---|---|---|
| D497,537 S | 10/2004 | O'Keene et al. | |
| 6,905,101 B1 * | 6/2005 | Dittmer | 248/274.1 |
| D540,330 S | 4/2007 | Eyman et al. | |
| D543,210 S | 5/2007 | Stenhouse et al. | |
| D543,547 S | 5/2007 | Muday et al. | |
| D543,548 S | 5/2007 | Muday et al. | |
| D553,135 S | 10/2007 | Muday et al. | |
| D558,560 S | 1/2008 | Ciungan | |
| D558,561 S | 1/2008 | Ciungan | |
| D558,562 S | 1/2008 | Ciungan et al. | |
| D558,563 S | 1/2008 | Ciungan | |
| D558,564 S | 1/2008 | Ciungan | |
| D559,087 S | 1/2008 | Ciungan | |
| D559,088 S | 1/2008 | Ciungan | |
| D560,221 S | 1/2008 | Hoglan et al. | |
| D560,222 S | 1/2008 | Anderson et al. | |
| D560,673 S | 1/2008 | Muday et al. | |
| 7,331,550 B2 | 2/2008 | Gillespie et al. | |
| D570,355 S | 6/2008 | Muday et al. | |
| D570,852 S | 6/2008 | Muday et al. | |
| D587,258 S | 2/2009 | Vaglica et al. | |
| 7,487,943 B1 | 2/2009 | Gillespie | |
| D587,716 S | 3/2009 | Hau et al. | |
| 7,513,469 B1 | 4/2009 | Ciungan | |
| 7,513,474 B2 | 4/2009 | Anderson et al. | |
| D593,080 S | 5/2009 | Russell et al. | |
| D593,104 S | 5/2009 | Gillespie | |
| D595,299 S | 6/2009 | Bures | |
| D595,702 S | 7/2009 | Bremmon et al. | |
| D595,723 S | 7/2009 | Bures | |
| D596,189 S | 7/2009 | Bures et al. | |
| D602,923 S | 10/2009 | Skull | |
| D605,185 S | 12/2009 | Russell et al. | |
| 7,641,163 B2 | 1/2010 | O'Keene | |
| D611,479 S | 3/2010 | Hau et al. | |
| D611,480 S | 3/2010 | Hau et al. | |
| D612,182 S | 3/2010 | Bremmon et al. | |
| D613,277 S | 4/2010 | Skull | |
| 7,738,245 B1 | 6/2010 | Stifal | |
| 7,753,332 B2 | 7/2010 | O'Keene | |
| D620,943 S | 8/2010 | Grey et al. | |
| D623,177 S | 9/2010 | Molter et al. | |
| D623,634 S | 9/2010 | Molter et al. | |
| D623,635 S | 9/2010 | Molter et al. | |
| D623,654 S | 9/2010 | Hau et al. | |
| 7,793,903 B2 | 9/2010 | Dittmer et al. | |
| D627,767 S | 11/2010 | Molter et al. | |
| D627,787 S | 11/2010 | Grey et al. | |
| 7,823,849 B2 | 11/2010 | Dittmer et al. | |
| 7,832,700 B2 | 11/2010 | Ciungan | |
| D628,459 S | 12/2010 | Minkley et al. | |
| D630,197 S | 1/2011 | Molter et al. | |
| D630,623 S | 1/2011 | Molter et al. | |
| D631,038 S | 1/2011 | Molter et al. | |
| 7,866,618 B2 | 1/2011 | Grabania et al. | |
| 7,866,621 B1 | 1/2011 | Walters | |
| 7,866,622 B2 | 1/2011 | Dittmer | |
| D631,874 S | 2/2011 | Molter et al. | |
| D631,876 S | 2/2011 | Molter et al. | |
| D632,287 S | 2/2011 | Molter et al. | |
| 7,891,620 B2 | 2/2011 | Grabania et al. | |
| D633,484 S | 3/2011 | Molter et al. | |
| D634,328 S | 3/2011 | Grey et al. | |
| D634,607 S | 3/2011 | Molter et al. | |
| D634,739 S | 3/2011 | Molter et al. | |
| D635,966 S | 4/2011 | Molter et al. | |
| D636,765 S | 4/2011 | Molter et al. | |
| 7,950,613 B2 | 5/2011 | Anderson et al. | |
| D640,672 S | 6/2011 | Molter et al. | |
| D640,673 S | 6/2011 | Molter et al. | |
| D640,675 S | 6/2011 | Molter et al. | |
| 7,954,780 B2 | 6/2011 | Dittmer | |
| D641,369 S | 7/2011 | Skull et al. | |
| D641,721 S | 7/2011 | Moscovitch et al. | |
| 7,975,976 B2 | 7/2011 | Wohlford | |
| 7,984,889 B2 | 7/2011 | Whitley et al. | |
| D642,583 S | 8/2011 | Dittmer et al. | |
| D643,835 S | 8/2011 | Molter et al. | |
| 8,094,438 B2 * | 1/2012 | Dittmer et al. | 361/679.01 |
| 8,508,918 B2 * | 8/2013 | Dittmer et al. | 361/679.01 |
| 2006/0244870 A1 * | 11/2006 | Yamato et al. | 348/836 |
| 2010/0001153 A1 | 1/2010 | Stenhouse et al. | |
| 2010/0091438 A1 | 4/2010 | Dittmer | |
| 2010/0208418 A1 | 8/2010 | Russell et al. | |
| 2010/0219315 A1 | 9/2010 | Muday et al. | |
| 2011/0002110 A1 | 1/2011 | Skull | |
| 2011/0019344 A1 | 1/2011 | Russell et al. | |
| 2011/0084187 A1 | 4/2011 | Muday et al. | |

* cited by examiner

TILT HEAD ASSEMBLIES AND METHODS OF USING THE SAME

RELATED APPLICATIONS

This application claims priority to U.S. Provisional Patent Application No. 61/583,811, filed Jan. 6, 2012, the disclosure of which is incorporated by reference herein in its entirety.

BACKGROUND

In a growing market of devices such as super slim televisions (some with thicknesses of less than 1 inch), it is desirable to reduce the overall thickness of any tilt head mechanism coupling the device to a wall or other mounting structure or surface. It is desirable to provide low profile television wall mount solutions with similar articulation to existing, more bulky mounts on the market. However, limitations may arise with low profile tilt heads, such as those with thicknesses approaching 1 inch, if the user wants to angle the tilt head up or down an appreciable amount (e.g., about 10 degrees downward). For example, with larger flat panel TVs, the rear bezel of the TV may strike the mounting surface well before achieving the desired 10 degrees of tilt.

Also, many of the latest low profile televisions have mounting attachment locations which are not symmetric about the center of the television. This adds further complication in making a mount which is slim, universal, and offers the same range of motion most end-users are accustomed to in addition to making the mount collapse as flat as possible. Specifically, the ability to tilt the television upward or downward to the desired angle based upon the viewing position becomes difficult due to hole patterns which vary vertically from brand to brand. For example, if a user desires the television to be angled about 10 degrees downward to accommodate for a lower viewing position, the amount of required television offset from the wall to achieve this angle can vary greatly between one brand to the next. This is due to a difference in height, from brand to brand, between the bottom of the television to the center of the mounting holes. For example, for the same 10 degree tilt angle, brand X may require about 1 inch of offset from the wall while brand Y may require 2.5 inches due to the mounting hole pattern being higher on the back of the television for brand Y than brand X. The higher hole pattern causes the bottom of the television to collide with the wall surface sooner for brand Y.

Some existing lower profile mounts on the market utilize a mechanism with a predetermined range of motion such that the tilt is coupled to the extension away from the wall. While this may create a smooth motion, it does not allow the user to minimize the distance the television sits away from the wall at any given tilt angle.

Therefore, it may be desirable to introduce a certain amount of extensibility away from the mounting surface (e.g., wall) such that the flat panel display or other device may be extended away or offset from the wall, tilted to the desired viewing angle, and then pushed back toward the mounting surface until the device's lower or upper edge rests on or near the mounting surface.

SUMMARY

According to a first aspect, embodiments of the invention are directed to a tilt head mechanism for use with a display device. The tilt head mechanism includes: a base plate member configured to connect to a vertical mounting structure or surface and an adapter plate member operatively connected to the base plate member. The adapter plate member has a front surface configured to connect to a display device and the front surface has a center point. The adapter plate member is independently: movable horizontally away from and toward the base plate member; and tiltable downwardly and upwardly relative to the vertical mounting structure or surface, wherein the front surface center point of the adapter plate member does not move substantially horizontally as the adapter plate member is tilted relative to the vertical mounting structure or surface.

In some embodiments, the adapter plate member is movable horizontally between a collapsed position with the front surface center point of the adapter plate member spaced a first distance from the base plate member and a fully extended position with the front surface center point of the adapter plate member spaced apart a second distance from the base plate member. In some embodiments, the adapter plate member is tiltable between a first downward angle relative to the vertical mounting structure or surface and a first upward angle relative to the vertical mounting structure or surface regardless of whether the adapter plate member is in the collapsed position or the fully extended position.

The tilt head mechanism may be configured such that the adapter plate member is: movable from a first position, wherein the adapter plate member is in the collapsed position and the front surface is substantially parallel to the vertical mounting structure or surface, to a second position, wherein the adapter plate member is in the fully extended position and the front surface is substantially parallel to the vertical mounting structure or surface; tiltable from the second position to a third position, wherein the adapter plate member is in the fully extended position and at the first downward angle relative to the vertical mounting structure or surface, wherein the front surface center point of the adapter plate member does not move substantially horizontally as the adapter plate member is moved from the second position to the third position; and movable from the third position to a fourth position, wherein the adapter plate member is between the fully extended position and the collapsed position and at the first downward angle relative to the vertical mounting structure or surface.

The tilt head mechanism may include at least one scissor assembly connecting the base plate member and the adapter plate member, with the scissor assembly adapted to move the adapter plate member between the collapsed position and the fully extended position. The adapter plate member may include a plurality of guide paths and the scissor assembly may include a plurality of followers, with each follower configured to engage a respective guide path to facilitate rotation between the first downward angle and the first upward angle.

As a second aspect, embodiments of the invention are directed to a display device system. The system includes a tilt head assembly and a display device. The tilt head assembly includes a base plate member operatively connected to a vertical mounting surface, an adapter plate member and a pair of spaced-apart scissor assemblies connecting the base plate member and the adapter plate member. The adapter plate member includes a plate portion and first and second spaced-apart flanges extending outwardly away from the plate portion. Each of the first and second flanges includes at least one guide path. The plate portion has a front surface configured to connect to a display device, and the front surface has a center point centered between the first and second flanges. Each scissor assembly includes at least one follower received in the guide path of a respective first and second flange of the adapter plate member. The display device is connected to the front surface of the adapter plate member. The adapter plate member and the display device connected thereto are independently: movable horizontally away from and toward the base plate member and the vertical mounting surface by extending and retracting the scissor assemblies; and tiltable downwardly and upwardly relative to the vertical mounting surface. Each follower translates within a respective guide path as the adapter plate member and the display device connected thereto are tilted relative to the vertical mounting surface. The front surface center point of the adapter plate member does not move substantially horizontally as the adapter plate member and the display device connected thereto are tilted relative to the vertical mounting surface.

As a third aspect, embodiments of the invention are directed to a method for tilting a flat panel display to a desired angle. The method includes: (a) connecting the flat panel display to a tilt head mechanism by connecting a rear surface of the flat panel display to a front surface of an adapter plate member of the tilt head mechanism, the adapter plate member front surface having a center point, the adapter plate member operatively connected to a base plate member of the tilt head mechanism that is operatively connected to a vertical wall, wherein the adapter plate member is independently: 1) movable horizontally away from and toward the base plate member and the wall; and 2) tiltable relative to the base plate and the wall; (b) moving the adapter plate member and the flat panel display connected thereto horizontally away from the base plate member and the wall such that the adapter plate member and the flat panel display connected thereto are in a second position; (c) from the second position, tilting the adapter plate member and the flat panel display connected thereto to a third position at a desired angle relative to the wall, wherein the center point of the adapter plate member front surface does not move substantially horizontally as the adapter plate member and the flat panel display connected thereto are tilted to the third position; and (d) from the third position, moving the adapter plate member and the flat panel display connected thereto at the desired angle horizontally toward the wall to a fourth position wherein a back portion of the flat panel display is adjacent to the wall.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF EMBODIMENTS OF THE INVENTION

Figure 1:
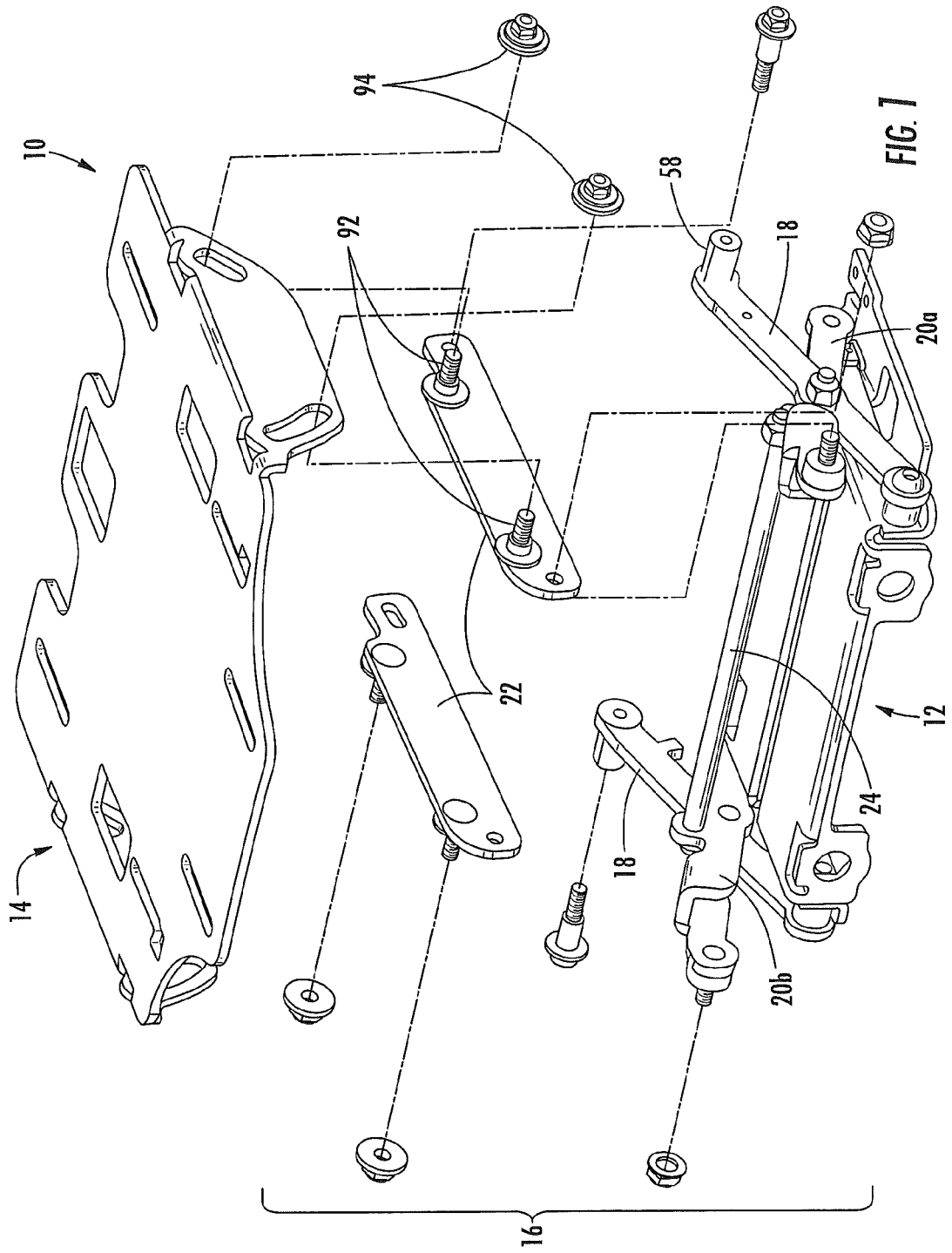
FIG. 1 is an exploded view of a tilt head assembly or mechanism according to some embodiments.

The present invention now will be described more fully with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. Thicknesses and dimensions of some components may be exaggerated for clarity.

As used herein, the term "comprising" or "comprises" is open-ended, and includes one or more stated features, integers, elements, steps, components or functions but does not preclude the presence or addition of one or more other features, integers, elements, steps, components, functions or groups thereof. As used herein, the term "and/or" includes any and all combinations of one or more of the associated listed items.

As used herein, the common abbreviation "e.g.," which derives from the Latin phrase "exempli gratia," may be used to introduce or specify a general example or examples of a previously mentioned item, and is not intended to be limiting of such item. If used herein, the common abbreviation "i.e.," which derives from the Latin phrase "id est," may be used to specify a particular item from a more general recitation.

The terminology used herein is for the purpose of describing particular embodiments only and is not intended to be limiting of the invention. As used herein, the singular forms "a," "an" and "the" are intended to include the plural forms as well, unless the context clearly indicates otherwise.

Well-known functions or constructions may not be described in detail for brevity and/or clarity.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, spatially relative terms, such as "under," "below," "lower," "over," "upper," "downward," "upward" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

As used herein, the term "about" used in connection with a claimed value means +/−10% of the claimed value in some embodiments.

The tilt head assemblies and mechanisms described in more detail below include a base plate member which may be attached to a mounting surface such as a wall or to one or more mounting structures attached to a mounting surface such as a wall. An adapter plate member is configured to operatively connect to the base plate member via at least one at least one guide path to establish a range for tilt motion as described below. The base plate member and the adapter plate member may be connected via at least one motion assembly, such as at least one scissor style mechanism, allowing the adapter plate member and guide paths to be moved away from the base plate member and mounting surface to permit free rotation of a television or other device connected to the adapter plate member without colliding with the mounting surface. The tilt range of motion and movement away from and toward the mounting surface are decoupled such that these motions may be independently controlled by the user.

An exploded view of a tilt head assembly or mechanism 10 according to some embodiments is illustrated in FIG. 1. The assembly 10 includes a base plate member 12 that is configured to attach or connect to a mounting surface such as a wall. Alternatively, the base plate member 12 can be attached or connected to the mounting surface via one or more intermediate components or mounting structures, such as articulating arm(s) and/or other brackets, plates and the like, as described below. An adapter plate member 14 is operatively connected to the base plate member 12 and is configured to connect to a device, such as a flat panel display or television or other electronic device. Alternatively, one or more intermediate components, such as a bracket, plate or the like, may attach or connect to the adapter plate member 14, with the intermediate component configured to attach or connect to an electronic device.

The base plate member 12 and the adapter plate member 14 may be connected by at least one scissor mechanism 16. In the illustrated embodiment, the tilt head mechanism 10 includes a pair of spaced-apart scissor assemblies 16, with each scissor assembly 16 connected to an opposing side portion of the base plate member 12. As described in greater detail below, each scissor assembly 16 may include a first scissor arm 18, a second scissor arm 20a or 20b and/or a follower plate member 22. The scissor assemblies 16 may be connected by a cross member 24 to provide stability during operation.

Figure 2A:
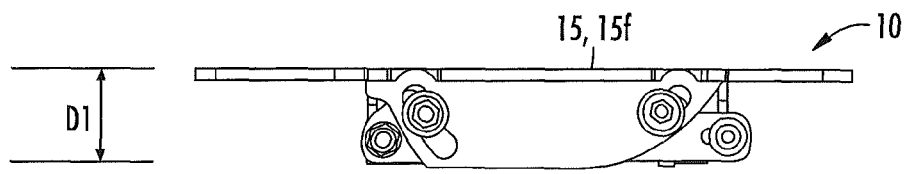
FIGS. 2A-2F are schematic drawings illustrating the range of motion of the tilt head mechanism of FIG. 1 according to some embodiments.
Figure 2B:
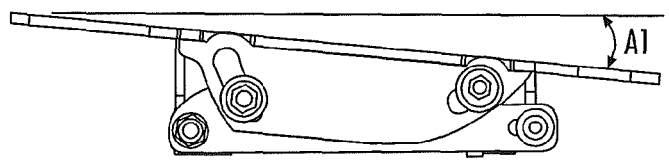
Figure 2C:
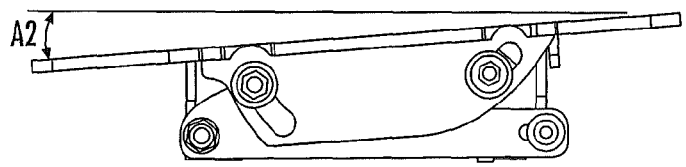
Figure 2D:
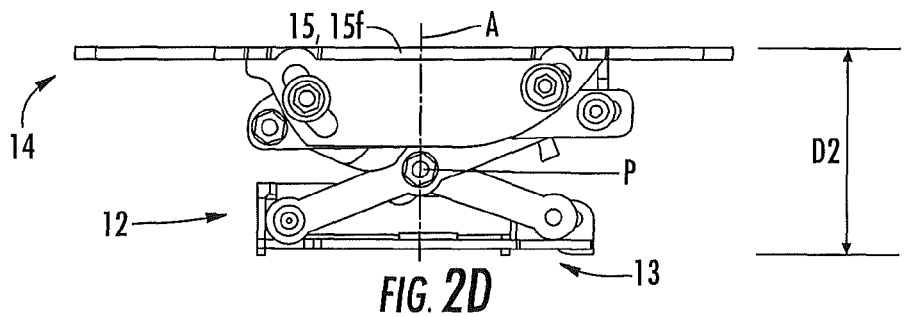

Referring now to FIGS. 2A-2F, the tilt head mechanism 10 is configured such that the adapter plate member 14 is independently: 1) movable away from and toward the base plate member 12 (e.g., along or parallel to a first axis A, as shown in FIG. 2D); and 2) rotatable or tiltable downwardly and upwardly relative to the base plate member 12. In other words, these degrees of motion are independent from one another, i.e., they are decoupled.

The tilt head mechanism 10 is shown in a "rest" position in FIG. 2A. In the rest position, the adapter plate member 14 is in a collapsed position with a plate portion 15 of the adapter plate member 14 and/or a front surface 15f thereof spaced a first distance D1 from a rear portion 13 of the base plate member 12 (or from a mounting surface or mounting structure to which the base plate member 12 is connected). In various embodiments, the first distance D1 is no greater than about 1 inch, no greater than 1 inch, no greater than about 1.1 inches, no greater than 1.1 inches and no greater than 1.25 inches.

The adapter plate member 14 is movable along or parallel to the first axis A between the collapsed position shown in FIG. 2A to a fully extended position shown in FIG. 2D. In the fully extended position, the plate portion 15 of the adapter plate member 14 and/or a front surface 15f thereof is spaced a second distance D2 from the rear portion 13 of the base plate member 12 (or from a mounting surface or mounting structure to which the base plate member 12 is connected). In various embodiments, the second distance D2 is at least 2.25 inches, at least about 2.5 inches and at least 2.5 inches. The adapter plate member 14 may be moved along or parallel to the first axis A to any position between the collapsed and fully extended position.

Figure 2E:
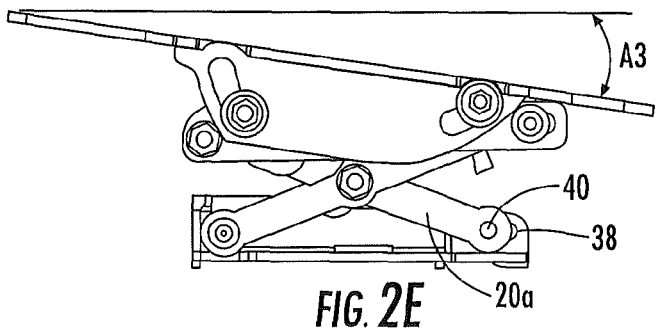
Figure 2F:
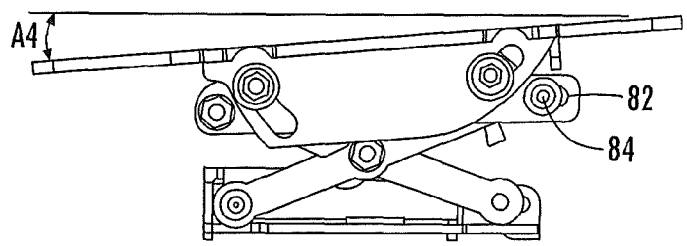

The adapter plate member 14 is rotatable or tiltable independent from the movement along or parallel to the first axis A. As shown in FIGS. 2B and 2C, with the adapter plate member 14 in its collapsed position, the adapter plate member 14 may be tilted downwardly to a first or maximum downward angle A1 (FIG. 2B) and upwardly to a first or maximum upward angle A2 (FIG. 2C). The adapter plate member 14 may be tilted downwardly or upwardly to any angle between the first downward angle A1 and the first upward angle A2 with the adapter plate member 14 in its collapsed position. As shown in FIGS. 2E and 2F, with the adapter plate member 14 in its fully extended position, the adapter plate member 14 may be tilted downwardly to a second or maximum downward angle A3 (FIG. 2E) and upwardly to a second or maximum upward angle A4 (FIG. 2F). The adapter plate member 14 may be tilted downwardly or upwardly to any angle between the second downward angle A3 and the second upward angle A4 with the adapter plate member 14 in its fully extended position. In some embodiments, the adapter plate member 14 may also be tilted between the second downward and second upward angles A3, A4 with the adapter plate member 14 at any intermediate position between the collapsed position and the fully extended position along or parallel to the axis A.

In some embodiments, the first downward angle A1 and the second downward angle A3 are substantially equal and/or the first upward angle A2 and the second upward angle A4 are substantially equal. In some embodiments, the second downward and upward angles A3, A4 are each at least about 5 degrees. In some embodiments, the second downward angle A3 is at least about 8 degrees and the second upward angle A4 is at least about 5 degrees. In some embodiments, the second downward angle A3 is at least 8 degrees and the second upward angle A4 is at least 5 degrees. In some embodiments, the second downward angle A3 is at least about 10 degrees and the second upward angle A4 is at least about 5 degrees. In some embodiments, the second downward angle A3 is at least 10 degrees and the second upward angle A4 is at least 5 degrees. In some embodiments, the second downward angle A3 is at least about 12 degrees and the second upward angle A4 is at least about 5 degrees. In some embodiments, the second downward angle A3 is at least 12 degrees and the second upward angle A4 is at least 5 degrees.

Figure 3A:
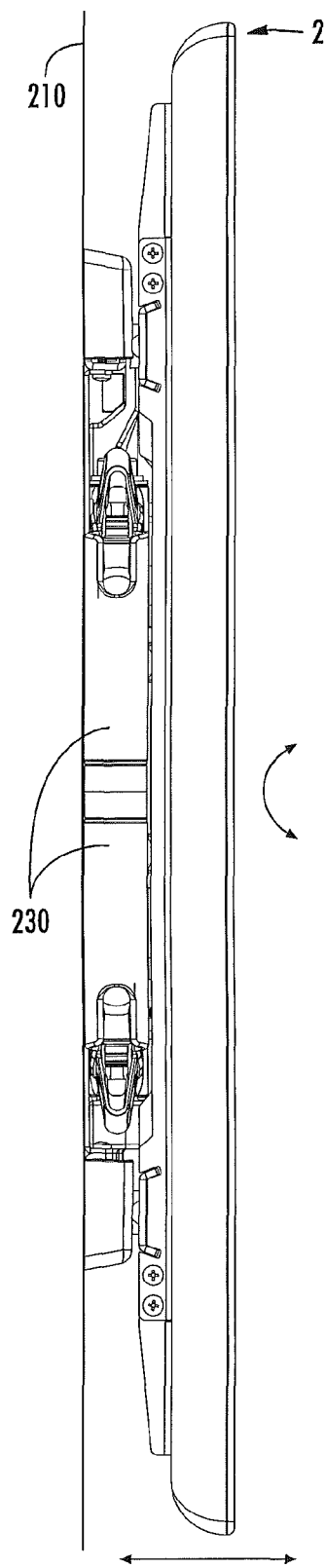
FIGS. 3A-3E are schematic drawings illustrating the range of motion of the tilt head mechanism of FIG. 1 with a flat panel display connected thereto relative to a mounting surface according to some embodiments.

The range of motion of the tilt head mechanism 10 and a flat panel display 200 connected thereto or received thereon is illustrated in FIGS. 3A-3E. As illustrated, the tilt head mechanism 10 is connected to mounting surface 210 such as a vertical wall. The tilt head mechanism 10 may be connected to the wall 210 via a wall bracket, articulating arm(s) and/or other mounting structure, as described in more detail below. The tilt head mechanism 10 and flat panel display 200 are shown in an exemplary first position in FIGS. 3A and 3B. In FIG. 3A, an optional articulating arm 230 least partially obscures the tilt head mechanism 10. The articulating arm 230 is hidden in FIGS. 3B-3E to more clearly show the range of motion of the tilt head assembly 10 and the connected flat panel display 200.

Figure 3B:
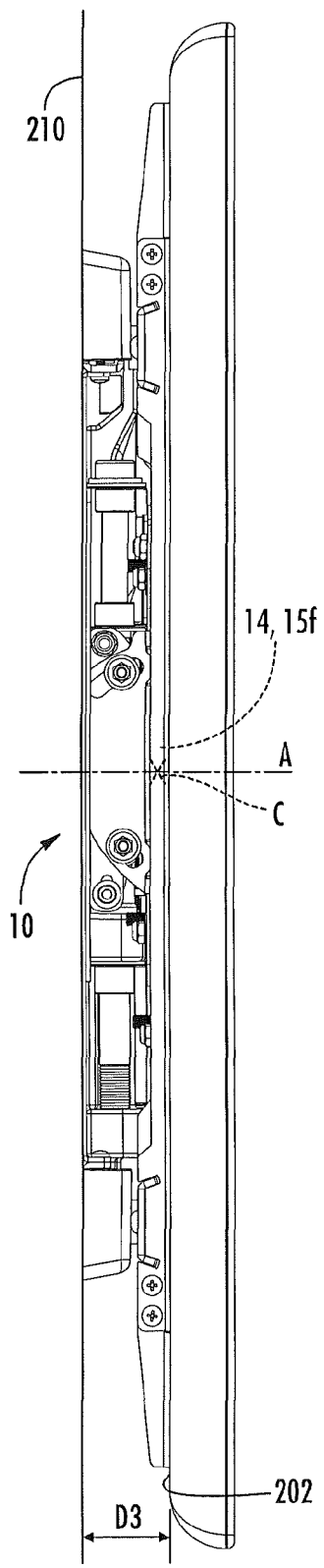

In the first position shown in FIG. 3B, the adapter plate member 14 is in the collapsed position (i.e., the position shown in FIG. 2A) and the front surface 15f of the adapter plate member 14 is substantially parallel to the wall 210. In the first position, a bottom rear portion 202 of the flat panel display 200 is spaced apart from the wall 210 a distance D3. The distance D3 may generally correspond to the distance D1 described above in reference to FIG. 2A.

Figure 3C:
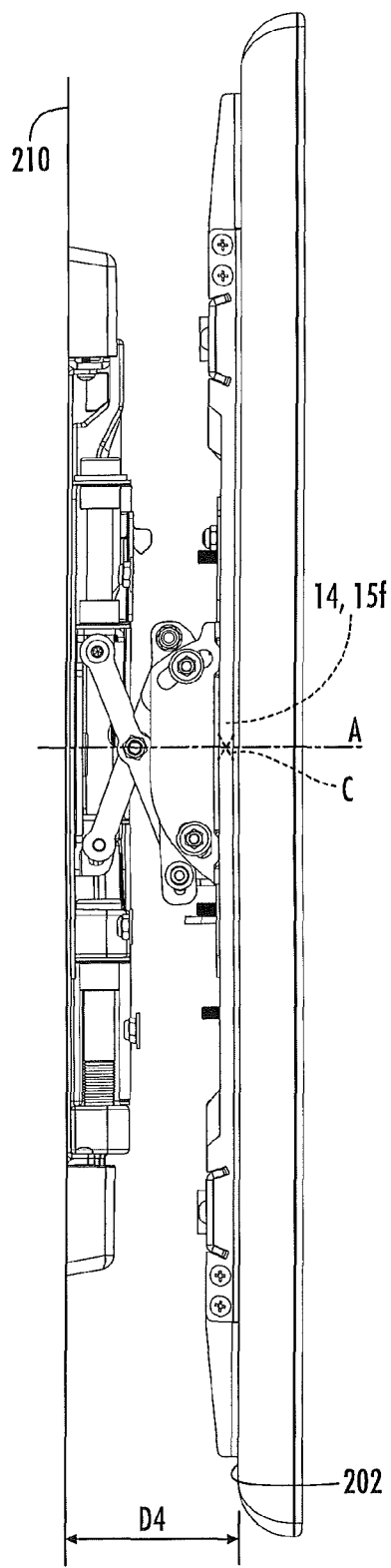

The adapter plate member 14 and the flat panel display 200 are movable from the first position to an exemplary second position shown in FIG. 3C. In the second position, the adapter plate member 14 and the flat panel display 200 are moved along or parallel to the axis A (which is a generally horizontal axis in the illustrated embodiment) away from the wall 210. For example, in the second position, the adapter plate member 14 may be in the fully extended position (i.e., the position shown in FIG. 2D). Alternatively, in the second position, the adapter plate member 14 may be between the collapsed position (FIG. 2A) and the fully extended position (FIG. 2D). In the second position, the bottom rear portion 202 of the flat panel display 200 is spaced apart from the wall 210 a distance D4. The distance D4 may generally correspond to the distance D2 described above in reference to FIG. 2D (i.e., if the adapter plate member 14 has been moved to the fully extended position). The distance D4 may be between the distances D1 and D2 described above if the adapter plate member 14 has been moved generally horizontally to an intermediate position between the collapsed position and the fully extended position.

The adapter plate member front surface 15f has a center point C, which will be defined in more detail below. In some embodiments, the front surface center point C does not move substantially vertically as the adapter plate member 14 and the flat panel display 200 are moved from the first position (FIG. 3B) to a second, fully extended position (FIG. 3C). In various embodiments, the front surface center point C moves less than about 0.25 inches, less than 0.25 inches, less than about 0.125 inches, less than 0.125 inches, less than about 0.0625 inches and less than 0.0625 inches vertically as the adapter plate member 14 and the flat panel display 200 are moved from the first position (FIG. 3B) to the second, fully extended position (FIG. 3C).

Figure 3D:
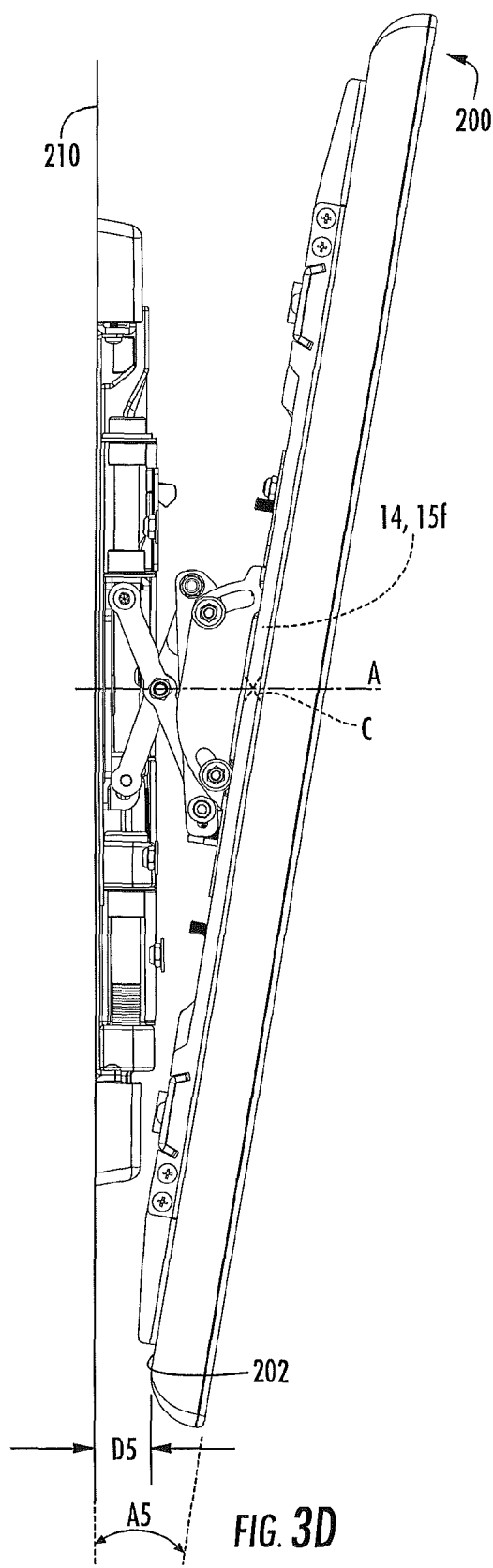

The adapter plate member 14 and the flat panel display 200 are rotatable or tiltable from the second position to a third position exemplified in FIG. 3D. For example, a user may grasp a top and/or a bottom portion of the flat panel display 200 and rotate or tilt the flat panel display 200 and the adapter plate member 14 to a desired viewing angle. In the third position, the adapter plate member 14 remains in the same or substantially the same extended position as in the second position (e.g., the fully extended position). Thus, in some embodiments, the front surface center point C does not move substantially along or parallel to the first axis A as the adapter plate member 14 and the flat panel display 200 are moved from the second position to the third position. Stated differently, in some embodiments, the front surface center point C does not move substantially horizontally as the adapter plate member 14 and the flat panel display 200 are rotated/tilted from the second position to the third position. In various embodiments, the front surface center point C moves less than about 0.25 inches, less than 0.25 inches, less than about 0.125 inches, less than 0.125 inches, less than about 0.0625 inches, less than 0.0625 inches, less than about 0.05 inches, less than about 0.02 inches and less than about 0.01 inches horizontally as the adapter plate member 14 and the flat panel display 200 are rotated/tilted from the second position to the third position. In the third position, the bottom rear portion 202 of the flat panel display 200 is spaced apart from the wall 210 a distance D5. The distance D5 is less than the distance D4 shown in FIG. 3C.

In the third position illustrated in FIG. 3D, the adapter plate member 14 and the flat panel display 200 are at a downward angle A5 relative to the vertical wall 210. The angle A5 may generally correspond to the maximum or second downward angle A3 as illustrated in FIG. 2E; alternatively, the adapter plate member 14 and the flat panel display 200 may be at a selected downward viewing angle between vertical and the angle A3. Although not illustrated, it will be understood that the adapter plate member 14 and the flat panel display 200 may also be rotated or tilted upward to reach the third position. For example, the adapter plate member 14 may rotated or tilted to the position shown in FIG. 2F, with the adapter plate member 14 and flat panel display 200 at the second or maximum upward angle A4 or some lesser desired upward viewing angle relative to the vertical wall 210. Again, in some embodiments, the front surface center point C does not move substantially horizontally as the adapter plate member 14 and the flat panel display 200 are rotated/tilted upwardly from the second position to the third position.

Figure 3E:
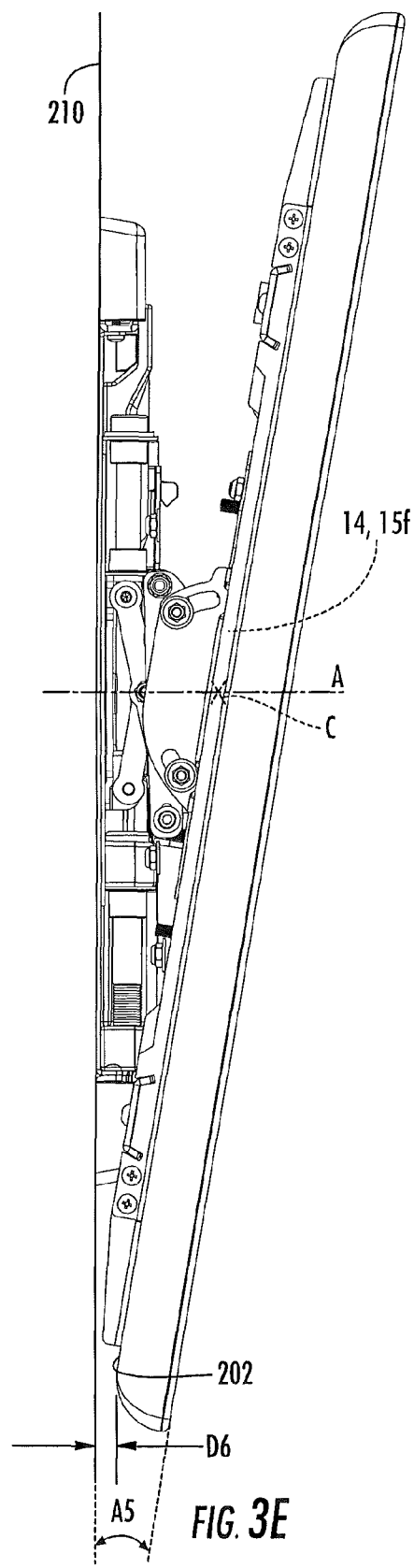

The adapter plate member 14 and the flat panel display 200 are movable along or parallel to the axis A from the third position to a fourth position exemplified in FIG. 3E. In the fourth position the adapter plate member 14 is between the collapsed position (FIG. 2B) and the fully extended position (FIG. 2E). The adapter plate member 14 and the flat panel display 200 remain at downward angle A5 (or other selected viewing angle established in the third position) relative to the vertical wall 210. In some embodiments, the front surface center point C does not move substantially vertically as the adapter plate member 14 and the flat panel display 200 are moved from the third position (FIG. 3D) to the fourth position (FIG. 3E). In various embodiments, the front surface center point C moves less than about 0.25 inches, less than about 0.125 inches and less than about 0.0625 inches vertically as the adapter plate member 14 and the flat panel display 200 are moved from the third position (FIG. 3D) to the fourth position (FIG. 3E).

In the fourth position, the bottom rear portion 202 of the flat panel display 200 is spaced apart from the wall 210 a distance D6. The distance D6 is less than the distance D5 shown in FIG. 3D. The distance D6 may be selected such that the bottom rear portion 202 of the flat panel display 200 is adjacent the wall 210 or even touching the wall 210.

It can be seen from FIGS. 3A-3E that the range of motion associated with moving the adapter plate member 14 and the flat panel device 200 away from and toward the wall 210 and the range of motion associated with rotating or tilting the adapter plate member 14 and the flat panel display 200 relative to the wall 210 are independent or decoupled. As such, the tilt head mechanism 10 allows for the flat panel display 200 to be rotated or tilted to a desired viewing angle while also achieving a very low profile. That is, the adapter plate member 14 and flat panel display 200 may be extended or urged (e.g., pulled) away from the wall 210 to provide sufficient clearance to allow the flat panel display 200 to be rotated or tilted to the desired viewing angle A5. After being rotated or tilted to the desired angle, the adapter plate member 14 and flat panel display 200 may be urged (e.g., pushed) back toward the wall 210 such that the rear portion 202 of the flat panel display 200 is adjacent or contacting the wall 210, thereby minimizing outward projection from the wall 210 while maintaining the desired viewing angle A5.

Accordingly, the tilt head mechanism 10 may provide advantages over designs wherein extension away from the wall and rotation/tilting relative to the wall are coupled. In such designs, the flat panel display simultaneously extends away from the wall as the display is rotated or tilted to the desired viewing angle. As a result, there remains a substantial gap between the rear portion of the display and the wall and an optimal low profile configuration is not realized. Any attempt to push the display back toward the wall results in a loss of the desired viewing angle due to the coupled nature of the translation and rotation/tilt degrees of motion.

Figure 4A:
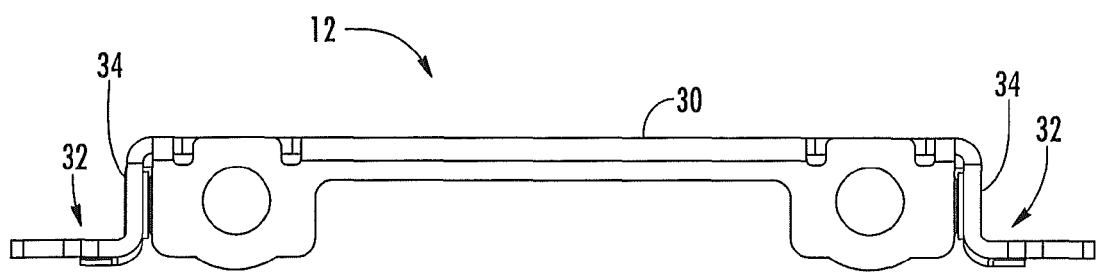
FIG. 4A is an end view of a base plate member of the tilt head mechanism of FIG. 1 according to some embodiments.
Figure 4B:
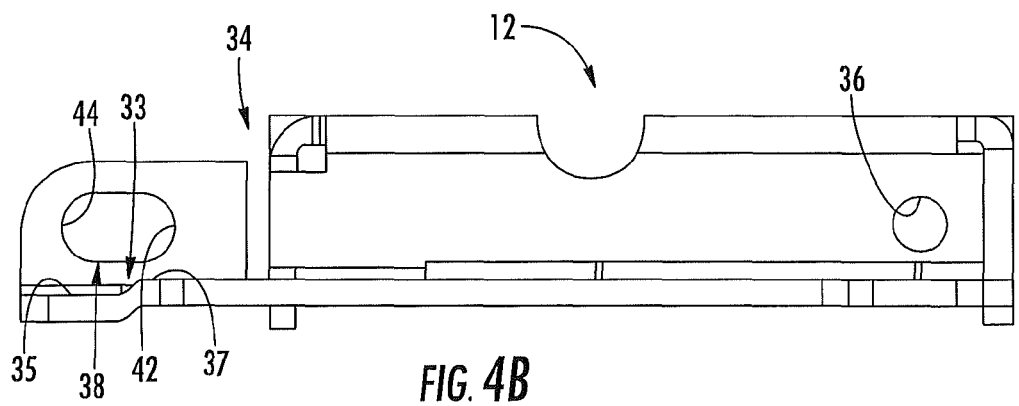
FIG. 4B is a side view of the base plate member of FIG. 4A.

Various components of the tilt head mechanism 10 will now be described in greater detail. The base plate member 12 is shown in FIGS. 4A and 4B. The base plate member 12 includes a raised center portion 30 and a valley portion 32 at each opposing side portion of the base plate member 12. A bottom portion of a scissor assembly 16 (FIG. 1) is received in each valley portion 32. A side portion 34 is positioned between each valley portion 32 and the raised portion 30. Each side portion 34 includes a first aperture 36 for connecting or fastening a first end portion of a respective first scissor arm 18. Each side portion 34 also includes a guide path 38 configured to receive a follower 40 (FIG. 2E) associated with a first end portion of a respective second scissor arm 20. In the illustrated embodiment, the guide path 38 is an elongated slot having opposing first and second ends 42, 44. The follower 40 (FIG. 2B) may comprise a bushing, pin and/or some other member that is configured to translate within the elongated slot as the adapter plate member 14 is moved between the collapsed position (e.g., FIG. 2A) and the fully extended position (e.g., FIG. 2D). In some embodiments, the follower 40 translates toward one of the first and second opposite ends 42, 44 when the adapter plate member 14 is moved toward the collapsed position and translates toward the other one of the first and second opposite ends 42, 44 when the adapter plate member 14 is moved toward the fully extended position.

As shown in FIG. 4B, each valley portion 32 may include a ramp feature 33. The ramp feature is characterized by a lower portion 35 and a relatively raised portion 37. When the adapter plate member 14 is in the collapsed position (e.g., FIG. 2A), the first end portion 62 of a respective second scissor arm 20a, 20b (FIGS. 6A and 6B) may reside in the lower portion 35. In this sense, the ramp feature 33 provides resistance to keep the scissor arms from coming out on their own, such as when a flat panel display is loaded onto the tilt head mechanism 10. Other, alternative, "catch" mechanisms are contemplated.

Figure 5:
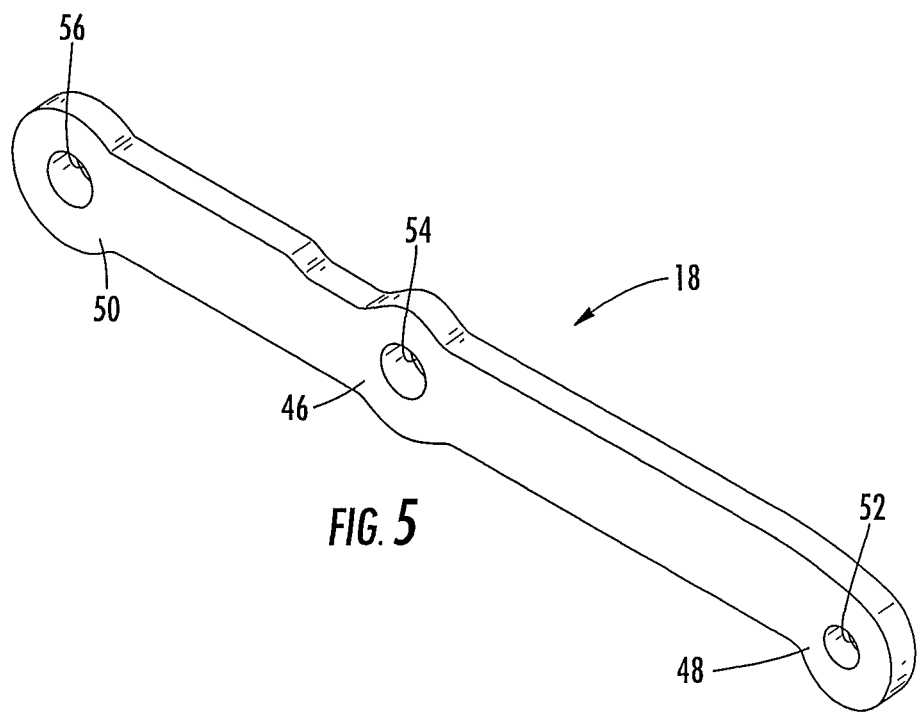
FIG. 5 is a perspective view of a first scissor arm of the tilt head mechanism of FIG. 1 according to some embodiments.

A first scissor arm 18 is shown in FIG. 5. The first scissor arm 18 includes a center portion 46 and first and second opposed end portion 48, 50. The first end portion 48 includes an aperture 52 such that the first scissor arm may be connected or fastened to the base plate member 12 at the aperture 36, as described above. The center portion 46 includes an aperture 54 such that the first scissor arm may be pivotally connected at a center portion of a respective second scissor arm 20a, 20b. The second end portion 50 includes an aperture 56 such that the first scissor arm 18 may be connected to an end portion of a respective follower plate 22. For example, the aperture 56 may be used to fasten or connect a bushing 58 (FIG. 1) or other follower member that may be received in a guide path of a respective follower plate 22, as will be described in greater detail below.

Figure 6A:
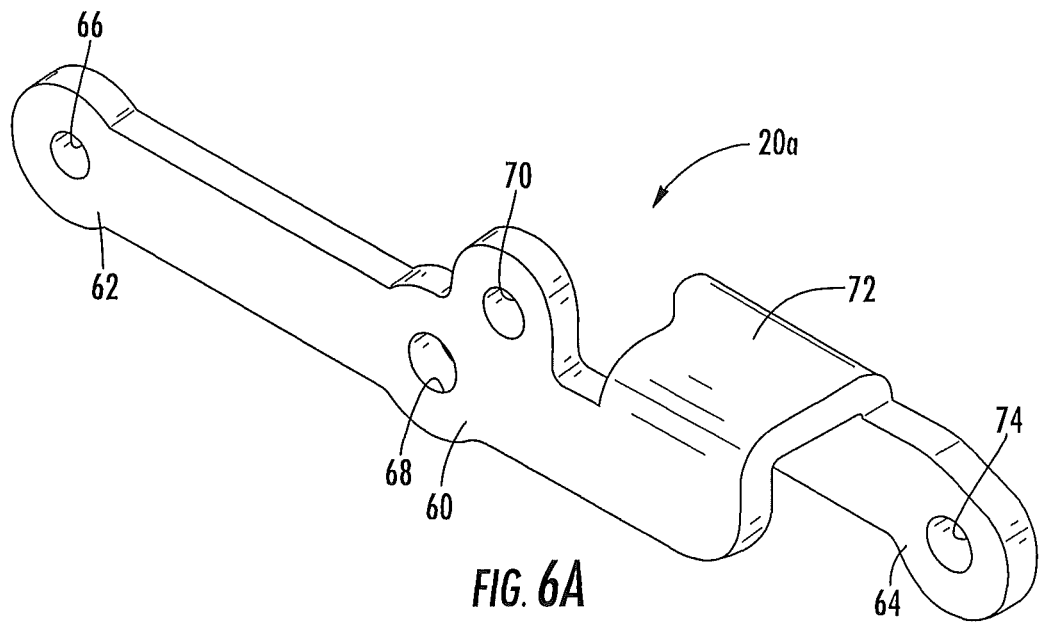
FIGS. 6A and 6B are perspective views of second scissor arms of the tilt head mechanism of FIG. 1 according to some embodiments.

A second scissor arm 20a is shown in FIG. 6A. The second scissor arm 20a includes a center portion 60 and first and second opposed end portions 62, 64. The first end portion includes an aperture 66 for connecting the second scissor arm 20a to the base plate member 12 at the guide path 38 (FIG. 4B). Specifically, the aperture 66 may be used to connect or fasten the follower 40 which engages the guide path 38 (FIG. 2E). As described above, the guide path 38 may take the form of an elongated slot, and the follower 40 may translate between opposite ends of the slot as the adapter plate member 14 moves between the collapsed position (e.g., FIG. 2A) and the fully extended position (e.g., FIG. 2D). In some embodiments, the follower 40 comprises a bushing or the like that is adapted to slide or otherwise translate within the slot.

The center portion 60 of the second scissor arm 20a includes a first aperture 68 such that the second scissor arm may be pivotally connected to a respective first scissor arm 18 the center portion 46 thereof (FIG. 5). Specifically, the first aperture 68 may be mated with the aperture 54 of the first scissor arm 18 and a suitable pivot member may be inserted therethrough to pivotally connect the first and second scissor arms 18, 20a. The center portion 60 of the second scissor arm 20a also includes a second aperture 70. The second aperture 70 is configured to receive and/or attach the cross member 24 that extends between the second scissor arms 20a, 20b (FIG. 1).

The second scissor arm 20a includes a raised portion 72 positioned between the center portion 60 and the second end portion 64. The raised portion 72 extends substantially transversely away from the center portion 60 such that the center portion 60 and the second end portion 64 are offset. The raised portion 72 is configured to reside above the first scissor arm 18 when the adapter plate member 14 is in its collapsed position (FIG. 2A). Thus, the center portion 72 along with the offset nature of the center portion 60 and the second end portion 64 facilitate a low profile configuration when the adapter plate member 14 approaches or arrives at its collapsed position.

The second end portion 64 of the second scissor arm 20a includes an aperture 74 such that the second scissor arm 20a may be attached or connected to an end portion of a respective follower plate 22, as described in more detail below.

Figure 6B:
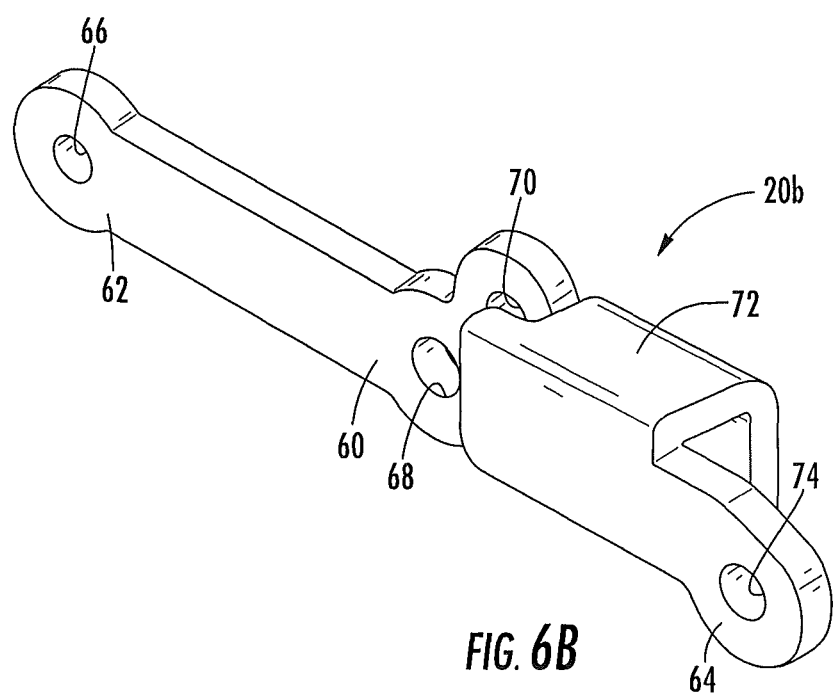

As set forth above, one of the scissor assemblies 16 includes the second scissor arm 20a and the other of the scissor assemblies 16 includes the second scissor arm 20b (FIG. 1). As shown in FIG. 6B, the second scissor arm 20b is substantially similar to the second scissor arm 20a. However, the raised portion 72 of the second scissor arm 20b extends in an opposite direction to that of the second scissor arm 20a to account for its location on the opposite side of the tilt head assembly 10.

Figure 7:
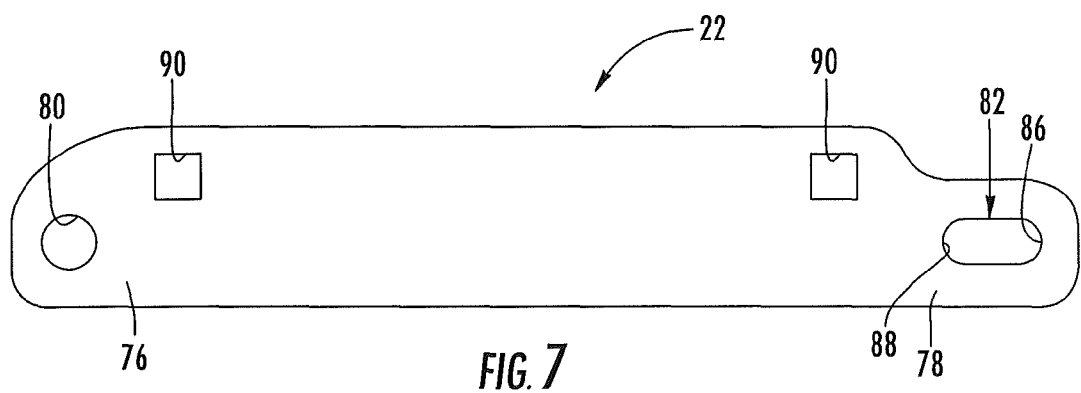
FIG. 7 is a plan view of a follower plate of the tilt head mechanism of FIG. 1 according to some embodiments.

A follower plate 22 is illustrated in FIG. 7. The follower plate 22 has first and second opposed end portions 76, 78. An aperture 80 is located at the first end portion 76 such that the second end portion 64 of a respective one of the second scissor arms 20a, 20b may be connected or attached thereto. Specifically, the aperture 74 of one of the second scissor arms 20a, 20b (FIGS. 6A and 6B) may be aligned with the aperture 80 of the follower plate 22 and a connecting member may be received therethrough.

A guide path 82 is located at the follower plate second end portion 78. The guide path 82 configured to receive a follower 84 (FIG. 2F) associated with the second end portion of a respective first scissor arm 18. In the embodiment shown in FIG. 8, the guide path 82 is an elongated slot having opposing first and second ends 86, 88. The follower 84 (FIG. 2F) may comprise the bushing 58 (FIG. 1) or other suitable member that is configured to translate within the elongated slot 82 as the adapter plate member 14 is moved between the collapsed position (e.g., FIG. 2A) and the fully extended position (e.g., FIG. 2D).

As illustrated in FIG. 7, the follower plate includes a pair of apertures 90 located between the first and second end portions 76, 78. The apertures 90 are configured to receive followers 92 (FIG. 1) that are in turn configured to engage guide slots of the adapter plate member 14, as described below. In various embodiments, the followers 92 include pins, bushings and the like. A shoulder washer 94 may be received on a distal end of each follower 92, and the shoulder washer 94 may engage and translate within the guide paths of the adapter plate member 14.

Figure 8A:
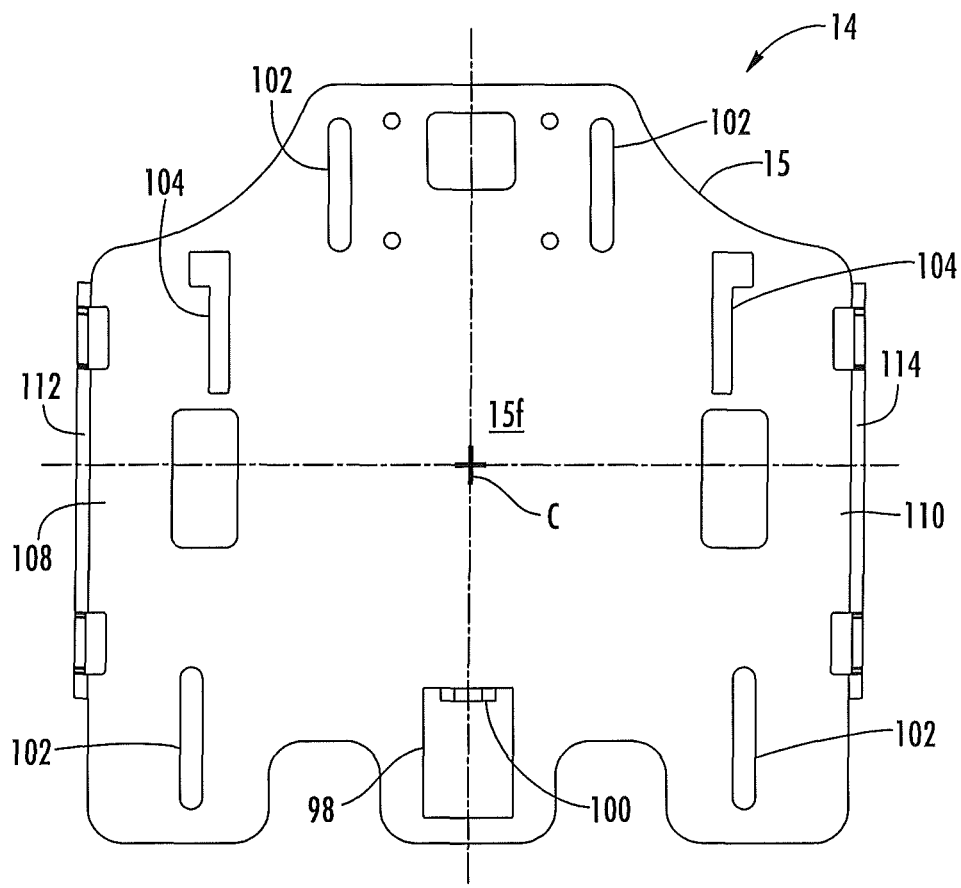
FIG. 8A is a top plan view of an adapter plate member of the tilt head mechanism of FIG. 1 according to some embodiments.
Figure 8B:
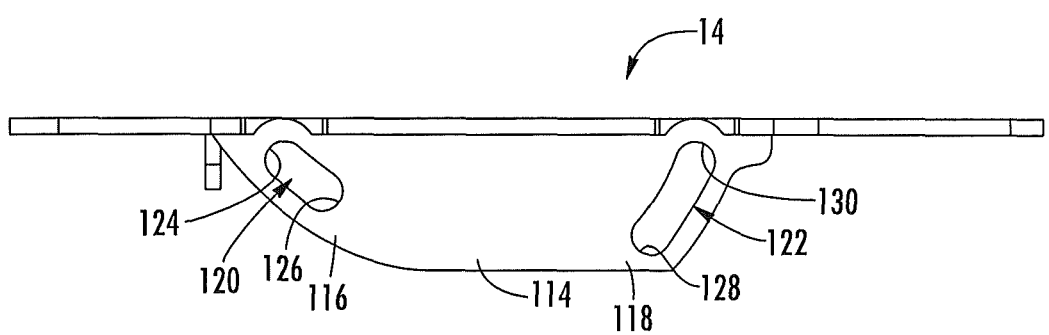
FIG. 8B is a side view of the adapter plate member of FIG. 8A.

The adapter plate member 14 is illustrated in FIGS. 8A and 8B. As set forth above, the adapter plate member 14 includes a plate portion 15 having a front or top surface 15f, with the front surface 15f having a center point C. The front surface 15f may be adapted to receive a sheet metal member 96 (FIG. 9), with the sheet metal member 96 configured to receive or connect to the rear portion of a flat panel display. The adapter plate member may include a cutout 98 providing access to a vertical adjustment nut 100 configured to engage a bolt associated with the sheet metal member 96. The adapter plate member 14 may include a plurality of slots 102 to facilitate vertical adjustment (panning) of the sheet metal member 96 and/or a device connected thereto. The adapter plate member may include other features such as support slots 104 to resist bending of the sheet metal member 96 and/or clearance openings 106 to help maintain the low profile nature of the tilt head mechanism 10. It is within the scope of the invention that the adapter plate member 14 includes a bracket or other component such as the sheet metal member 96 on the front surface 15f thereof.

In the embodiment illustrated in FIG. 8A, the plate portion 15 of the adapter plate member 14 includes first and second opposed side portions 108, 110. A flange 112 extends outwardly away from the adapter plate member plate portion 15 at the first side portion 108 and a similar flange 114 extends outwardly away from the adapter plate front surface 15 at the second side portion 110.

The flange 114 is shown in FIG. 8B. The flange 114 includes first and second opposed end portions 116, 118. A first guide path 120 is positioned at the first end portion 116 and a second guide path 122 is positioned at the second end portion 118. Each guide path 120, 122 is configured to receive one of the followers 92 and/or the shoulder washers 94 associated with the follower plate member 22 (FIG. 1). That is, the followers 92 and/or the shoulder washers 94 are configured to engage the guide paths 120, 122 to facilitate rotation of the adapter plate member 14 between the second downward angle A3 and the second upward angle A4 (FIGS. 2E and 2F).

As illustrated, the guide paths 120, 122 may take the form of elongated slots. The first slot 120 has first and second opposite ends 124, 126 and the second slot 122 has first and second opposite ends 128, 130. The slots 120, 122 and the followers 92 are adapted such that the one of the followers 92 translates within a respective one of the slots 120, 122. One of the followers 92 translates toward one of the first and second opposite ends 124, 126 of the first slot 120 when the adapter plate member 14 is tilted to the second downward angle A3 (FIG. 2E) and translates toward the other one of the first and second ends 124, 126 when the adapter plate member 14 is tilted to the second upward angle A4 (FIG. 2F). Similarly, the other one of the followers 92 translates toward one of the first and second opposite ends 128, 130 of the second slot 122 when the adapter plate member 14 is tilted to the second downward angle A3 and translates toward the other one of the first and second ends 128, 130 when the adapter plate member 14 is tilted to the second upward angle A4. The followers 92 and/or the shoulder washers 94 may be shaped, sized and configured to resist any sliding motion within the guide paths 120, 122 due to the weight of the TV or other device attached to the adapter plate member 14. Alternatively, the followers 92 and/or the shoulder washers 94 may be shaped, sized and configured to roll within the guide paths 120, 122 and another mechanism to resist sliding motion may be employed. In some embodiments, the tilt head assembly 10 is "self-balancing" during operation, as is understood by those of skill in the art.

The guide paths or slots 120, 122 may be curved or substantially straight. For example, as illustrated in FIG. 8B, the first guide path 120 is substantially straight and the second guide path 122 is curved.

The flange 112 is substantially similar to the flange 114. Thus, the flange 112 may include guide paths 120, 122 that are configured to receive followers 92 in the same manner described above in reference to the flange 114. The flanges 112 and 114 may be symmetrical relative to the front surface 15f of the adapter plate member 14 and/or relative to a transverse plane extending therethrough.

The front surface center point C may be positioned equidistantly between the flanges 112, 114. The center point may also be within a plane transverse to the front surface 15f and extending between the pivot points P (FIG. 2D) defined by each first arm 18 and a respective second arm 20a, 20b.

As described above, the tilt head assembly 10 may be used with additional components. For example, referring to FIG. 9, the sheet metal member 96 may be attached or connected to the front surface of the tilt head mechanism 10. The tilt head mechanism 10 and/or the sheet metal member 96 may be attached or connected to a bracket 220, such as a TV bracket. The bracket 220 may include horizontal and vertical members 222, 224 to provide additional support for a device connected thereto. For example, a rear portion of a flat panel display may connect or attach to the horizontal and vertical members 222, 224 in additional to the tilt head mechanism 10 and/or the sheet metal member 96. The bracket 220 may extend, retract and rotate/tilt together with the tilt head mechanism 10.

Figure 9:
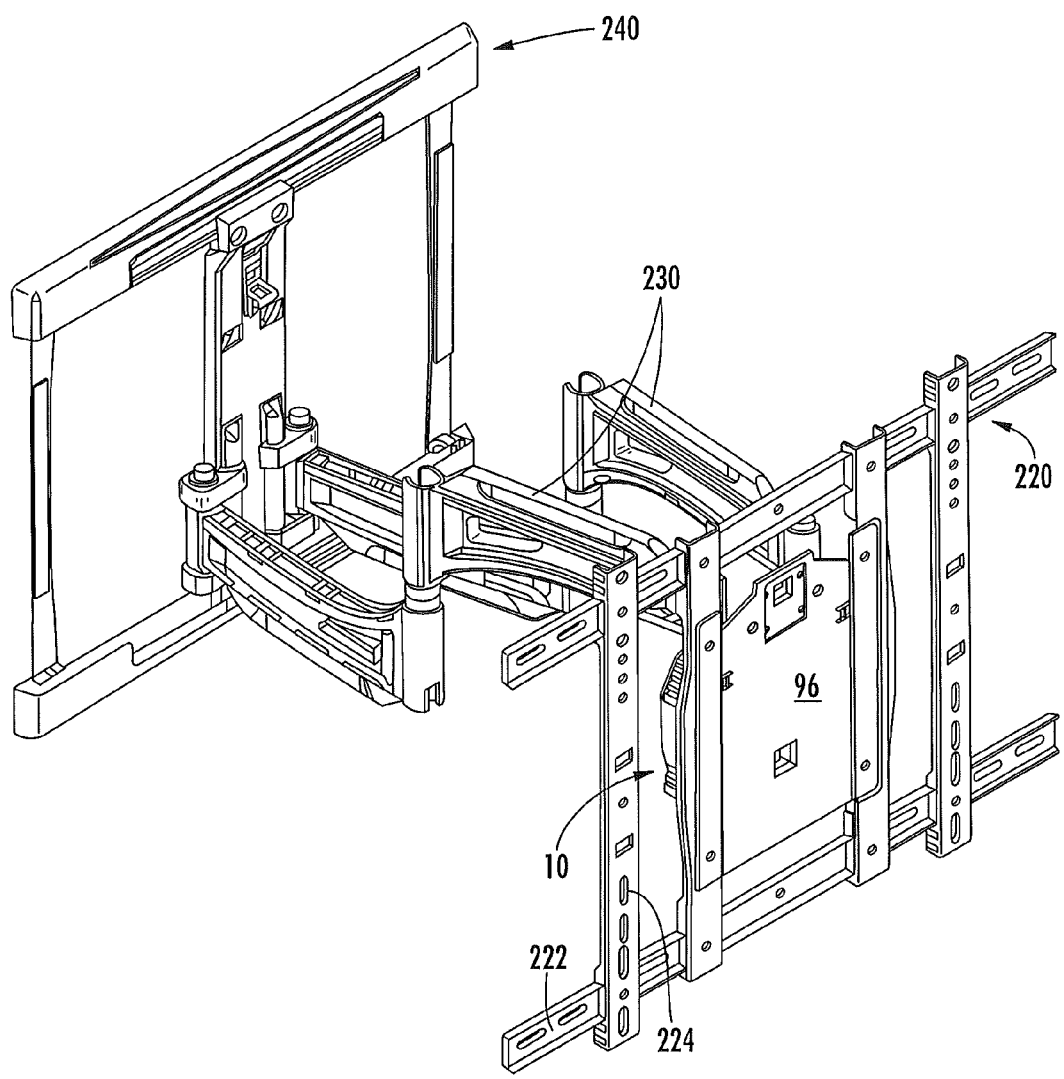
FIG. 9 is a perspective view of the tilt head mechanism of FIG. 1 used in conjunction with other mounting components according to some embodiments.

Still referring to FIG. 9, the tilt head mechanism may also be used in connection with one or more articulating arms 230, which may allow for additional extensibility away from the mounting surface or wall, and/or a mounting structure such as a wall bracket 240.

It is noted that some components of the tilt head assembly 10, such as some fasteners, have not been described in detail herein but are readily discernable from the figures and one of ordinary skill in the art would recognize that any suitable fastener or the like may be used for a particular application. Moreover, although the above description generally refers to discrete components, it is contemplated that one or more of the components could be broken into more than one component, could be combined with another component or could be omitted altogether. As one example, the flanges 112, 114 and/or the guide paths associated therewith could be included as part of or attached to the scissor assemblies, and the follower plates 22 and/or the followers associated therewith could be included as part of or attached to the adapter plate member. Further, other "motion assemblies" aside for the scissor style mechanisms described herein are contemplated. Exemplary alternative motion assemblies include hydraulic assemblies, pneumatic assemblies, gear mechanisms (e.g., worm gear, rack and pinion, etc.) and the like. Moreover, although the guide paths described herein are generally depicted as slots, the guide paths may also be any other suitable structure capable of guiding a follower, such as channels, grooves, cam surfaces and the like.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

That which is claimed is:

1. A tilt head mechanism for use with a display device, the tilt head mechanism comprising:
   a base plate member configured to connect to a vertical mounting structure or surface, the base plate member comprising a plurality of guide paths; and
   an adapter plate member having a front surface configured to connect to a display device, the adapter plate member comprising a plurality of guide paths;
   at least one scissor assembly connecting the base plate member and the adapter plate member, the scissor assembly comprising a plurality of first followers configured to engage corresponding ones of the base plate member guide paths, the scissor assembly further comprising a plurality of second followers configured to engage corresponding ones of the adapter plate member guide paths;
   wherein, with the base plate member connected to the vertical mounting structure or surface, the adapter plate member is independently:
      movable horizontally away from and toward the base plate member, wherein each first follower translates within a corresponding base plate member guide path as the adapter plate is moved horizontally away from and toward the base plate member; and
      tiltable downwardly and upwardly relative to the vertical mounting structure or surface, wherein each second follower translates within a corresponding adapter plate member guide path as the adapter plate is tilted relative to the vertical mounting structure or surface.

2. The tilt head mechanism of claim 1, wherein the front surface of the adapter plate member comprises a center point, and wherein the adapter plate member is movable horizontally between a collapsed position with the front surface center point of the adapter plate member spaced a first distance from the base plate member and a fully extended position with the front surface center point of the adapter plate member spaced apart a second distance from the base plate member.

3. The tilt head mechanism of claim 2, wherein the first distance is no greater than about 1 inch and wherein the second distance is at least about 2.5 inches.

4. The tilt head mechanism of claim 2, wherein the adapter plate member is tiltable between a first downward angle relative to the vertical mounting structure or surface and a first upward angle relative to the vertical mounting structure or surface regardless of whether the adapter plate member is in the collapsed position or the fully extended position.

5. The tilt head mechanism of claim 4, wherein the first downward angle is at least about 10 degrees relative to the vertical mounting structure or surface and the first upward angle is at least about 5 degrees relative to the vertical mounting structure or surface.

6. The tilt head mechanism of claim 4, configured such that the adapter plate member is:
   movable from a first position, wherein the adapter plate member is in the collapsed position and the front surface is substantially parallel to the vertical mounting structure or surface, to a second position, wherein the adapter plate member is in the fully extended position and the front surface is substantially parallel to the vertical mounting structure or surface;
   tiltable from the second position to a third position, wherein the adapter plate member is in the fully extended position and at the first downward angle relative to the vertical mounting structure or surface, wherein the front surface center point of the adapter plate member does not move substantially horizontally as the adapter plate member is moved from the second position to the third position; and
   movable from the third position to a fourth position, wherein the adapter plate member is between the fully extended position and the collapsed position and at the first downward angle relative to the vertical mounting structure or surface.

7. The tilt head mechanism of claim 4, wherein the scissor assembly adapted to move the adapter plate member between the collapsed position and the fully extended position.

8. The tilt head mechanism of claim 4, wherein each second follower is configured to engage a respective adapter plate guide path to facilitate rotation between the first downward angle and the first upward angle.

9. The tilt head mechanism of claim 4, wherein the adapter plate member includes a pair of outwardly extending spaced-apart flanges, each flange including at least one of the adapter plate guide paths, and wherein the at least one scissor assembly comprises a pair of spaced-apart scissor assemblies, each scissor assembly including at least one of the second followers configured to engage the guide path of a respective flange to facilitate rotation between the first downward angle and the first upward angle.

10. The tilt head mechanism of claim 9, wherein each flange includes a pair of the adapter plate guide paths, wherein each adapter plate guide path is an elongated slot having first and second opposite ends, wherein each scissor assembly includes a pair of the second followers, each one configured to translate within a respective one of the slots, wherein each follower translates toward one of the first and second opposite ends of the slot when the adapter plate member is tilted to the first downward angle and translates toward the other one of the first and second opposite ends of the slot when the adapter plate member is tilted to the first upward angle.

11. The tilt head mechanism of claim 4, wherein each first follower is configured to engage a respective base plate guide path to facilitate movement between the collapsed position and the fully extended position.

12. The tilt head mechanism of claim 11, wherein the at least one scissor assembly includes a pair of spaced-apart scissor assemblies, one each connected to opposing sides of the base plate member, wherein each opposing side of the base plate member includes one of the base plate guide paths comprising a slot having first and seconding opposite ends, wherein each first follower translates toward one of the first and second opposite ends of the slot when the adapter plate member is moved to the collapsed position and translates toward the other one of the first and second opposite ends of the slot when the adapter plate member is moved to the fully extended position.

13. The tilt head mechanism of claim 4, comprising a pair of scissor assemblies, each scissor assembly including:
first and second arms, each arm having first and second opposed end portions and a center portion, the first and second arms pivotally connected at their center portions, the first end portion of each arm connected to the base plate member; and
a follower plate, the follower plate including a plurality of the second followers, the follower plate having first and second opposed end portions, the first end portion of the follower plate connected to the second end portion of the first arm and the second end portion of the follower plate connected to the second end portion of the second arm;
wherein the second end portion of the follower plate includes a slot having first and second opposite ends and wherein the second end portion of the first arm includes a third follower configured to engage the slot, wherein the third follower translates toward one of the first and second opposite ends of the slot when the adapter plate member is moved to the collapsed position and translates toward the other one of the first and second opposite ends of the slot when the adapter plate member is moved to the fully extended position.

14. The tilt head assembly of claim 13, further comprising a cross member extending between and connecting the scissor assemblies.

15. The tilt head assembly of claim 1, wherein the front surface of the adapter plate member comprises a center point, and wherein the front surface center point of the adapter plate member does not move substantially vertically as the adapter plate member is moved horizontally away from and toward the base plate member.

16. A display device system, comprising:
a tilt head assembly, comprising:
a base plate member operatively connected to a vertical mounting surface, the base plate member comprising a plurality of guide paths;
an adapter plate member having a plate portion, the adapter plate member having first and second spaced-apart flanges extending outwardly away from the plate portion, each of the first and second flanges including at least one flange guide path, the plate portion having a front surface configured to connect to a display device; and
a pair of spaced-apart scissor assemblies connecting the base plate member and the adapter plate member, wherein each scissor assembly includes a plurality of first followers received in corresponding ones of the base plate member guide paths, and wherein each scissor assembly includes a plurality of second followers received in corresponding ones of the flange guide paths; and
a display device connected to the front surface of the adapter plate member;
wherein the adapter plate member and the display device connected thereto are independently:
movable horizontally away from and toward the base plate member and the vertical mounting surface by extending and retracting the scissor assemblies, wherein each first follower translates within a respective base plate guide path as the adapter plate member and the display device connected thereto are moved horizontally away from and toward the base plate member; and
tiltable downwardly and upwardly relative to the vertical mounting surface, wherein each second follower translates within a respective flange guide path as the adapter plate member and the display device connected thereto are tilted relative to the vertical mounting surface.

17. The system of claim 16, wherein the adapter plate front surface comprises a center point centered between the first and second flanges, wherein the adapter plate member and the display device connected thereto are movable horizontally between a collapsed position with the front surface center point of the adapter plate member spaced a first distance from the base plate member and a fully extended position with the front surface center point of the adapter plate member spaced apart a second distance from the base plate member, wherein the adapter plate member and the display device received thereon are tiltable between a first downward angle relative to the vertical mounting surface and a first upward angle relative to the vertical mounting surface regardless of whether the adapter plate member and the display device connected thereto are in the collapsed position or the fully extended position, and wherein the tilt head assembly is configured such that the adapter plate member and the display device connected thereto are:
movable from a first position, wherein the adapter plate member and the display device connected thereto are in the collapsed position and the front surface of the adapter plate member is substantially parallel to the vertical mounting surface, to a second position, wherein the adapter plate member and the display device connected thereto are in the fully extended position and the front surface of the adapter plate member is substantially parallel to the vertical mounting surface;
tiltable from the second position to a third position, wherein the adapter plate member and the display device connected thereto are in the fully extended position and at the first downward angle relative to the vertical mounting surface, wherein the front surface center point of the adapter plate member does not move substantially horizontally as the adapter plate member and the display device connected thereto are moved from the second position to the third position; and
movable from the third position to a fourth position, wherein the adapter plate member and the display device connected thereto are between the fully extended position and the collapsed position and at the first downward angle relative to the vertical mounting surface.

18. The system of claim 17, wherein the display device connected to the adapter plate member front surface has a bottom rear portion, and wherein:
- in the first position, the bottom rear portion of the display device is substantially at the first distance away from the base plate member;
- in the second position, the bottom rear portion of the display device is substantially at the second distance away from the base plate member;
- in the third position, the bottom rear portion of the display device is at a third distance away from the base plate member, the third distance being between the first and second distances; and
- in the fourth position, the bottom rear portion of the display device is at a fourth distance away from the base plate member, the fourth distance being less than the third distance.

19. The system of claim 18, wherein, in the fourth position, the bottom rear portion of the display device is positioned adjacent the vertical mounting surface.

20. A method for tilting a flat panel display to a desired angle, the method comprising:
- providing a tilt head mechanism comprising:
  - a base plate member configured to connect to a vertical mounting structure or surface, the base plate member comprising a plurality of guide paths; and
  - an adapter plate member having a front surface configured to connect to a display device, the adapter plate member comprising a plurality of guide paths;
  - at least one scissor assembly connecting the base plate member and the adapter plate member, the scissor assembly comprising a plurality of first followers configured to engage corresponding ones of the base plate member guide paths, the scissor assembly further comprising a plurality of second followers configured to engage corresponding ones of the adapter plate member guide paths;
- wherein the adapter plate member is independently:
  - movable in a direction orthogonal to the adapter plate member front surface away from and toward the base plate member, wherein each first follower translates within a corresponding base plate member guide path as the adapter plate is moved in the direction orthogonal to the adapter plate member front surface away from and toward the base plate member; and
  - tiltable downwardly and upwardly relative to the base plate member, wherein each second follower translates within a corresponding adapter plate member guide path as the adapter plate is tilted relative to the base plate member;
- operatively connecting the base plate member to a wall;
- connecting the flat panel display to the tilt head mechanism by operatively connecting a rear surface of the flat panel display to the front surface of the adapter plate member;
- moving the adapter plate member and the flat panel display connected thereto horizontally away from the base plate member and the wall such that the adapter plate member and the flat panel display connected thereto are in a second position;
- from the second position, tilting the adapter plate member and the flat panel display connected thereto to a third position at a desired angle relative to the wall, wherein a center point of the adapter plate member front surface does not move substantially horizontally as the adapter plate member and the flat panel display connected thereto are tilted to the third position; and
- from the third position, moving the adapter plate member and the flat panel display connected thereto at the desired angle horizontally toward the wall to a fourth position wherein a back portion of the flat panel display is adjacent to the wall.

* * * * *